US008473883B2

(12) United States Patent
German

(10) Patent No.: US 8,473,883 B2
(45) Date of Patent: Jun. 25, 2013

(54) ABSTRACTION FOR ARRAYS IN INTEGRATED CIRCUIT MODELS

(75) Inventor: Steven M. German, Wayland, MD (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 13/197,061

(22) Filed: Aug. 3, 2011

(65) Prior Publication Data

US 2013/0036391 A1 Feb. 7, 2013

(51) Int. Cl.
  *G06F 9/455* (2006.01)
  *G06F 17/50* (2006.01)
(52) U.S. Cl.
  USPC ........... 716/107; 716/106; 716/111; 716/112; 703/2
(58) Field of Classification Search
  USPC ........................ 716/106, 107, 111, 112; 703/2
  See application file for complete search history.

(56) References Cited

U.S. PATENT DOCUMENTS

| 5,953,519 | A | 9/1999 | Fura |
| 7,031,898 | B2 | 4/2006 | Jain et al. |
| 7,725,850 | B2 | 5/2010 | Darden et al. |
| 2002/0108093 | A1 | 8/2002 | Moondanos et al. |
| 2006/0190864 | A1 | 8/2006 | Ganai et al. |
| 2008/0295054 | A1* | 11/2008 | Alter et al. ......................... 716/6 |
| 2009/0012771 | A1 | 1/2009 | Wilson |
| 2010/0107131 | A1 | 4/2010 | Bjesse |
| 2010/0107132 | A1* | 4/2010 | Bjesse .............................. 716/5 |
| 2010/0250187 | A1 | 9/2010 | Zuber et al. |

OTHER PUBLICATIONS

Bjesse, Per, "Word-Level Sequential Memory Abstraction for Model Checking", Formal Methods in Computer-Aided Design (FMCAD'08), Portland, Oregon, Nov. 17-20, 2008, 9 pages.

* cited by examiner

*Primary Examiner* — Nha Nguyen
(74) *Attorney, Agent, or Firm* — Stephen R. Tkacs; Stephen J. Walder, Jr.; Preston J. Young

(57) ABSTRACT

The illustrative embodiments provide a mechanism for abstraction for arrays in integrated circuit designs. The mechanism constructs abstract models directly from an analysis of the system. The abstract models are both sound and complete for safety properties: a safety property holds in the abstract model if and only if the property holds in the original model. The mechanism of the illustrative embodiments eliminates the need for iterative abstraction refinement. The mechanism of the illustrative embodiments can find small models that verify a system in some cases where other approaches are unable to find a small model. The approach constructs an abstract design from the original design. The abstracted design may have smaller arrays than the original design. The mechanism checks the correctness of the abstracted design by model checking.

20 Claims, 8 Drawing Sheets

*FIG. 4*
COMPUTATION OF $size^k(v, a)$
| ARRAY a=MEM | | | |
|---|---|---|---|
| v | ADDRC | DATAC | MEM |
| k = 0 | 0 | 0 | 0 |
| k = 1 | 0 | 1 | 0 |
| k = 2 | 0 | 1 | 0 |
| $size^2$(COUT, MEM) = 1 | | | |
| $size^2$(SAFE, MEM) = 2 | | | |
| ARRAY a=DATAC | | | |
|---|---|---|---|
| v | ADDRC | DATAC | MEM |
| k = 0 | 0 | 0 | 0 |
| k = 1 | 0 | 0 | 0 |
| $size^1$(COUT, DATAC) = 1 | | | |
| $size^1$(SAFE, DATAC) = 1 | | | |
| ARRAY a=ADDRC | | | |
|---|---|---|---|
| v | ADDRC | DATAC | MEM |
| k = 0 | 0 | 0 | 0 |
| k = 1 | 0 | 1 | 0 |
| k = 2 | 0 | 2 | 0 |
| k = 3 | 0 | 3 | 0 |
| k = n | 0 | n | 0 |
*FIG. 5A*
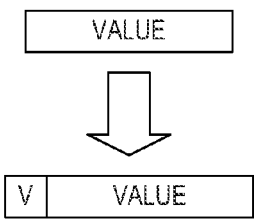
*FIG. 5B*
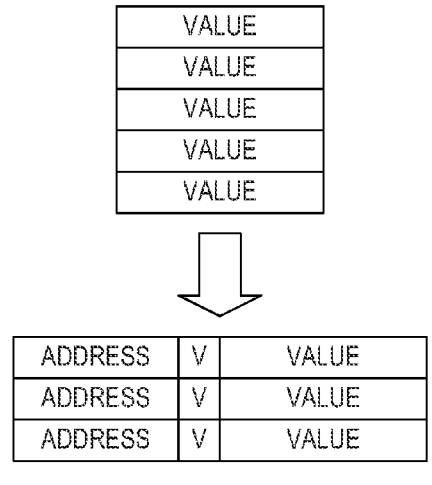

FIG. 6A

```
type data_record is record
 value: data_type;
 def: boolean;
end record;
```

FIG. 6B

```
function op_record(a,b: data_type) return data_type is
variable result: data_type;
begin
 result.value := op(a.value, b.value);
 result.def := a.def and b.def;
 return result;
end;
```

FIG. 6C

```
function mux(a: boolean; e1,e2: data_type) return
data_type is
begin
 if a then return e1; else return e2; end if;
end function;
```

FIG. 6D

```
type boolean_record is record
 value: boolean;
 def: boolean;
end record;

function mux_def(a: boolean_record; e1_def, e2_def:
boolean) return boolean is
begin
 if not a.def then return false; end if;
 if a.value then return e1_def; else return e2_def;
  end if;
end;

function mux_record(a: boolean_record; b,c:
data_record) return data_record is
variable r: data_record;
begin
 r.value := mux(a.value, b.value, c.value);
 r.def := mux_def(a, b.def, c.def);
 return r;
end;
```

FIG. 6E

```
type array_domain is integer 0 to adequate_size - 1;

type mem_records_type is array(array_domain) of
data_record;

type mem_addr_type is array(array_domain) of
addr_type;

type mem_type is record
 records: mem_records_type;
 addr: mem_addr_type;
end record;
```

*FIG. 6F*

```
type address_record is record
 value: addr_type;
 def: boolean;
end record;

function mem_read(mem: mem_type; addr: address_record)
return data_record is
variable r: data_record;
variable index: array_domain;
variable found: boolean := false;
begin
 -- if address is not defined, set r.def and return
 if not addr.def then r.def := false; return r;
 end if;
 -- check whether addr is one of the addresses in the
    mem array
 for i in array_domain loop
  if mem.addr(i) = addr.value then index := i;
    found := true;
  end if;
 end loop;

-- if the addr is not found in the array, set r.def
    and return
 if not found then r.def := false; return r; end if;

-- address is found in the array
 r.def := mem.records(index).def;
 r.value := mem.records(index).value;
 return r;
end;
```

*FIG. 6G*

```
function mem_write(mem: mem_type; addr:
address_record; data: data_record)
   return mem_type is
variable mem_r: mem_type;
begin
-- copy mem to mem_r
mem_r := mem;

-- if addr is undefined, set all values in mem to
   undefined and return
if not addr.def then
 for i in array_domain loop
   mem_r.records(i).def := false;
 end loop;
 return mem_r;
end if;

-- update the element records
for i in array_domain loop
 if mem.addr(i) = addr.value then
   mem_r.records(i).value := data.value;
   mem_r.records(i).def := data.def;
 end if;
end loop;
return mem_r;
end;
```

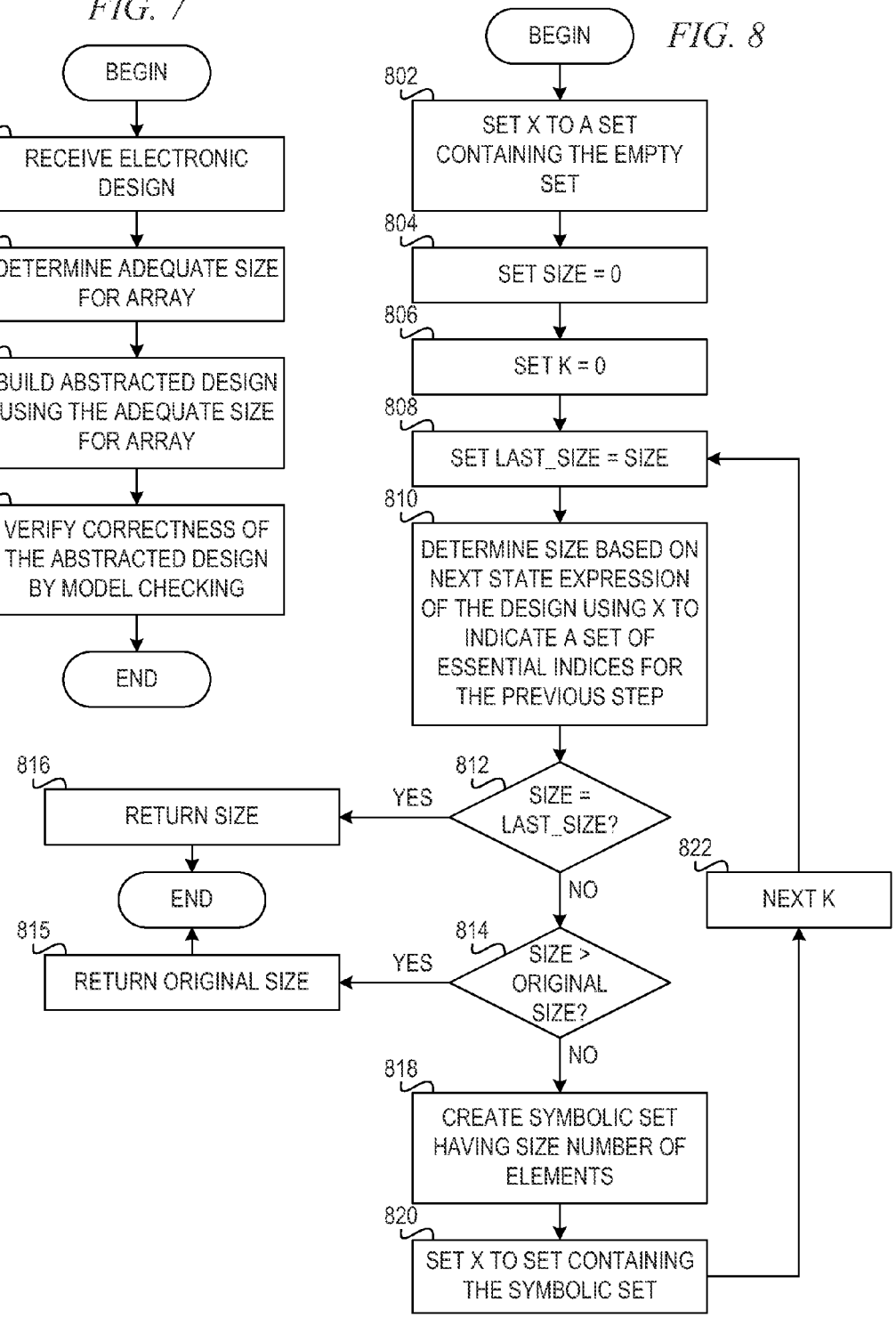

ABSTRACTION FOR ARRAYS IN INTEGRATED CIRCUIT MODELS

BACKGROUND

The present application relates generally to an improved data processing apparatus and method and more specifically to mechanisms for abstraction for arrays in integrated circuit models.

Systems with arrays are difficult to verify by model checking because arrays introduce many state variables and have complex addressing logic. In many cases, there is regularity in the way a system accesses its arrays. It is often possible to use such regularity to find a system with smaller arrays, such that correctness of the system with the smaller arrays implies correctness of the original system. This is the basic idea of array abstraction.

Large arrays are a barrier to verifying many designs. Arrays are not a niche; many units have arrays. Recently developed algorithms reason without fully expanding arrays into a bit-level model.

Most previous approaches to array abstraction create smaller models through an iterative process of abstraction and refinement. These approaches maintain an abstract model that is sound. If a correctness property holds in the abstract model, the original model also has the correctness property. If the abstract model fails to have the correctness property, the solution refines the abstract model. Refinement is the process of analyzing executions on which the correctness property fails and constructing a new model that does not have these executions. Abstraction refinement is an iterative process that may take many steps to prove or disprove a correctness property.

Some previous approaches use bounded abstraction. For bounded model checking, one models a small number of time steps and only models the addresses that are accessed in the bounded interval. An array accesses only a small number of addresses in a bounded interval. A bounded abstract model size depends on the number of time steps. This approach may result in many time steps to prove a correctness property by induction.

Another approach provides unbounded abstraction by building an abstract model by abstraction-refinement. This approach chooses modeled addresses non-deterministically. Modeled addresses have normal array semantics. For unmodeled addresses, reads return a non-deterministic value. The approach over-approximates the behavior of the original system. This approach provides conservative abstraction for safety properties. Each modeled address is characterized by a constant latency, which is the number of clock cycles from the time data is read from an array until data affects the output. The method cannot reduce the size of arrays in designs with unbounded latency, such as designs that read data from an array and use it after an unbounded interval or designs with clock gating.

SUMMARY

In one illustrative embodiment, a method, in a data processing system, is provided for array abstraction in an electronic design model. The method comprises receiving, in the data processing system, an original design model having at least one memory array. A correctness property of the original design model depends on an unbounded output of the at least one memory array. The method further comprises determining, by the data processing system, a reduced size for an abstracted memory array in an abstracted design model such that correctness of the abstracted design model implies correctness of the original design model. The method further comprises building, by the data processing system, the abstracted design model using the reduced size for the abstracted memory array. The method further comprises verifying, by the data processing system, correctness of the abstracted design model by model checking.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 4 illustrates computation of the size of an example abstracted array in accordance with the illustrative embodiment;

FIG. 5A illustrates a composite signal in accordance with an illustrative embodiment;

FIG. 5B illustrates an abstracted array in accordance with an illustrative embodiment;

FIGS. 6A-6G illustrate construction of an abstracted model using a hardware description language in accordance with an example embodiment;

FIG. 7 is a flowchart illustrating operation of a mechanism for verifying electronic designs with memory arrays and unbounded latency in accordance with an illustrative embodiment;

FIG. 8 is a flowchart illustrating operation of a mechanism for determining an adequate size for a reduced, abstracted array in accordance with an illustrative embodiment;

DETAILED DESCRIPTION

Figure 1:
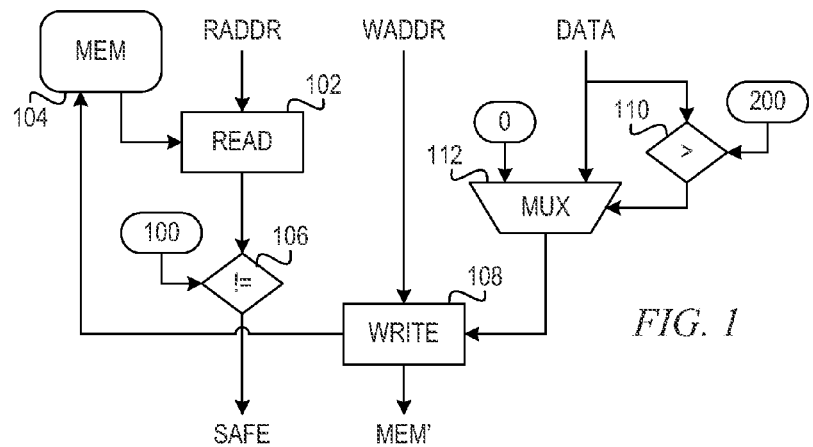
FIG. 1 is an example electronic design with a memory array in which aspects of the illustrative embodiments may be implemented.

The illustrative embodiments provide a mechanism for abstraction for arrays in integrated circuit designs. The mechanism constructs abstract models directly from an analysis of the system. The abstract models are both sound and complete for safety properties: a safety property holds in the abstract model if and only if the property holds in the original model. Thus, the mechanism of the illustrative embodiments eliminates the need for iterative abstraction refinement.

The mechanism of the illustrative embodiments can find small models that verify a system in some cases where other approaches are unable to find a small model. The approach constructs an abstract design from the original design. The abstracted design may have smaller arrays than the original design. The mechanism checks the correctness of the abstracted design by model checking.

The mechanism reads in a description of an electronic design containing one or more arrays. The mechanism models the design using the following primitive operations:

$op(e_1, \ldots e_n)$ represents an arbitrary combinational function having n input signals and a signal output.

$mux(a, b, c)$ represents a multiplexor with control signal a, and data inputs b, c. When a=0, input b is selected; when a=1, input c is selected.

a[addr] represents the result of reading from an array a at address addr.

write(a, addr, value) represents the value of the array a after writing to address addr with value value.

A design can contain signal state variables and array state variables. On each clock cycle, the next-state value of each state variable is specified by a next-state expression. The illustrative embodiments assume the design has one or more property output signals. The goal of verification is to show that in all operations of the design, starting from its initial states, the property output signals are always true.

The mechanism of the illustrative embodiments computes an adequate size for the arrays in the design. In many cases, the mechanism may find an adequate size that is smaller than the size of the arrays in the original design. A size n for an array is said to be adequate if the following conditions are equivalent:

(a) The property signals are always true in the original design.

(b) The property signals are always true in the abstracted design with arrays of size n.

The mechanism builds an abstracted design using the adequate size for arrays. The mechanism then verifies the correctness of the abstracted design by model checking. Model checking is a standard method used to verify the correctness of finite-state systems such as hardware designs.

The illustrative embodiment defines operational semantics for executing systems that is appropriate when arrays have been replaced with smaller abstract arrays. The illustrative embodiment provides an algorithm for analyzing a system to determine the size of a sound and complete array abstraction. The mechanism of the illustrative embodiment also builds an abstracted version of the system.

The illustrative embodiment assumes the existence of a set V of at least two signal values. Let 0, 1 be distinct signal values. The illustrative embodiment assumes that for each domain value $i \in V$, there is a constant symbol $c_i$ such that $c_i$ evaluates to i. For $k \geq 0$, a k-ary operator op is a function op: $V^k \rightarrow V$.

In order to give meaning to an array expression a[i], where the value of i is not in the domain of a, the illustrative embodiment introduces an undefined value $\perp \notin V$. Let $V^+ = V \cup \{\perp\}$. The semantics propagate the undefined value onward, starting from an array access that is outside the domain of the array. In the case of mux expressions, an expression has a defined value provided the first argument has a value in $\{0, 1\}$ and the selected argument of the mux has a defined value.

An array value is a function in $V \rightarrow V^+$, intuitively mapping addresses into values. An array value is said to be pure if all of the elements in the range of the array value are elements of V. The illustrative embodiment allows array values to be partial functions whose domains are not equal to the entire set of signal values V. The illustrative embodiment uses array values that are partial functions on V to reason about systems containing an array without representing all of the array's elements.

A signal variable is a name that can be assigned signal values, and an array variable is a name that can be assigned array values. Let $X_s$ be the set of signal variables and $X_a$ be the set of array variables. The illustrative embodiment defines signal expressions and array expressions to be the smallest sets of expressions satisfying the following definitions. A variable (respectively, expression) is either a signal variable (respectively, expression) or an array variable (respectively, expression). For each k, there are k-ary signal operator symbols.

1. A signal variable is a signal expression.
2. If op is a k-ary operator symbol and $e_1, \ldots, e_k$ are signal expressions, then $op(e_1, \ldots, e_k)$ is a signal expression.
3. If $e_1, e_2, e_3$ are signal expressions, then $mux(e_1, e_2, e_3)$ is a signal expression.
4. An array variable is an array expression.
5. If a is an array expression and e is a signal expression, then a[e] is a signal expression.
6. If a is an array expression and $e_1, e_2$ are signal expressions, then $write(a, e_1, e_2)$ is an array expression.

Electronic designs sometimes have arrays where wilting is conditional. For example, writing can be controlled by an enable signal whose value varies. Conditional writing can be modeled by assigning a special array index that is never read. It is also possible to incorporate conditional writing or multiplexors of array values into the model, but at the cost of added complexity.

A state assigns values to variables. A state assigns a signal value in V to each signal variable and assigns a pure array value to each array variable. Note that states only contain the values in V, not the undefined value. The domain of an array expression in a state a is the set of index values for which the array expression is defined. For an array variable a, $D(a, \sigma)$ is defined as $dom(\sigma(a))$, the domain of the function value assigned to a. Array write operations do not change the domain of an array. The domain of $write(a_1, e_1, e_2)$ in state $\sigma$ is inductively defined by $D(write(a_1, e_1, e_2), \sigma) = D(a_1, \sigma)$. For an array variable a, the root of a is $root(a) = a$. The root of a write expression is $root(write(b, e_1, e_2)) = root(b)$. A type $\mathcal{T}$ is a non-empty set of states such that if $\sigma_1$ and $\sigma_2$ are elements of $\mathcal{T}$ then for all array variables $a_1$ $dom(\sigma_1(a)) = dom(\sigma_2(a))$. The size of a state $\sigma$, written $|\sigma|$, is a function from array variables to natural numbers, defined by $|\sigma|(a) = |dom(\sigma(a))|$.

The size of a type $\mathcal{T}$ is $|\mathcal{T}| = |\sigma|$, for some $\sigma$ in $\mathcal{T}$.

In the following, e, $e_1$, $e_2$, ..., are signal expressions and a is an array expression.

The illustrative embodiment defines the value of an expression with respect to a state σ as follows:

1. σ[[v]]=σ(v), where v is a signal variable.

2. $\sigma[\![op(e_1, \ldots, e_n)]\!] = \begin{cases} OP(\sigma[\![e_1]\!], \ldots, \sigma[\![e_n]\!]), \text{ if } \sigma[\![e_i]\!] \neq \bot, \\ \quad \text{for } i = 1, \ldots, n, \text{ where } OP \\ \quad \text{is the interpretation} \\ \quad \text{of the operator symbol } op \\ \bot \text{ if for some } i, \sigma[\![e_i]\!] = \bot \end{cases}$ 3. $\sigma[\![mux(e_1, e_2, e_3)]\!] = \begin{cases} \sigma[\![e_2]\!] \text{ if } \sigma[\![e_1]\!] = 0 \\ \sigma[\![e_3]\!] \text{ if } \sigma[\![e_1]\!] = 1 \\ \bot \text{ if } \sigma[\![e_1]\!] \notin \{0, 1\} \end{cases}$ 4. σ[[a]]=σ(a), where a is an array variable.

5. $\sigma[\![write(a, e_1, e_2)]\!] = \begin{cases} (\sigma[\![a]\!])[\sigma[\![e_1]\!] \leftarrow \sigma[\![e_2]\!]] \\ \quad \text{if } \sigma[\![e_1]\!] \in D(a, \sigma) \\ \sigma[\![a]\!] \text{if } \sigma[\![e_1]\!] \in V - D(a, \sigma) \\ undef(a, \sigma) \text{if } \sigma[\![e_1]\!] = \bot \end{cases}$ 6. $\sigma[\![a[e]]\!] = \begin{cases} (\sigma[\![a]\!])(\sigma[\![e]\!]) \text{if } \sigma[\![e]\!] \in D(a, \sigma) \\ \bot \text{ if } \sigma[\![e]\!] \notin D(a, \sigma) \end{cases}$ There are three cases in the semantics of array writes. The first case updates a single element of an array when $e_1$ has a value in the domain of the array. In the second case, $e_1$ has a defined value in V, but the value is outside the domain of the array. In this case, the value of the array is not changed by the write operation. Note that the operation of writing to an array does not extend the domain of the array. In the third case, the index $e_1$ has the undefined value ⊥. For an array expression a and a state σ, the illustrative embodiment defines undef(a, σ) to be a function mapping all elements of D(a, σ) to ⊥.

A signal expression e is said to be satisfied by a state σ[[e]]=1. The illustrative embodiment uses σ⊨e to denote that a satisfies e. A signal expression e is said to be satisfiable if there exists a state that satisfies e, and e is said to be valid if it is satisfied by all states.

A system $\mathcal{M}$ has the form $(\mathcal{S}, \mathcal{I}, \mathcal{N}, \mathcal{O}, \mathcal{E})$. $\mathcal{S}$ is a set of signal and array variables forming the state variables of the system. $\mathcal{I}$ is a set of input signal variables. $\mathcal{N}$ defines the next-state function of the system. $\mathcal{N}$ is a function from the variable names in $\mathcal{S}$ to expressions, such that if e is a signal variable, then $\mathcal{N}$(e) is a signal expression, and if a is an array variable, then $\mathcal{N}$(a) is an array expression. For an array variable a, we require that root($\mathcal{N}$(a))=a; that is, the next state expression for an array variable a must be formed by a sequence of writes to a. $\mathcal{O}$ is a set of signal variables that are the outputs of the system, and $\mathcal{E}$ is a function mapping variables in $\mathcal{O}$ to signal expressions. The sets $\mathcal{S}$, $\mathcal{I}$, $\mathcal{O}$ must be pairwise disjoint.

The illustrative embodiment defines the executions of a system by giving an operational semantics based on expansions of the next-state functions for state variables. Given a system $\mathcal{M}$ and a state variable s ∈ $\mathcal{S}$ the illustrative embodiment defines:

$s^0$=s, $s^{k+1}=\mathcal{N}(s)[\mathcal{S}/\mathcal{S}^k, \mathcal{I}/\mathcal{I}^k]$, for k=0, 1, ..., where $\mathcal{S}/\mathcal{S}^k$ replaces each variable $s_j$ in $\mathcal{S}$ with the expression $(s_j)^k$, and $\mathcal{I}/\mathcal{I}^k$ replaces each input variable μ in $\mathcal{I}$ with a fresh signal variable $\mu^k$. For an output variable v ∈ $\mathcal{O}$, the output value at step k depends on the state and input variables at step k, $v^k=\mathcal{E}(v)[\mathcal{S}/\mathcal{S}^k, \mathcal{I}/\mathcal{I}^k]$, for k=0, 1, ...

For an arbitrary expression e over the variables of $\mathcal{M}$, the illustrative embodiment defines $e^k$=e$[\mathcal{S}/\mathcal{S}^k, \mathcal{I}/\mathcal{O}^k, \mathcal{I}/\mathcal{O}^k]$.

The safety properties of a system are specified by its output signals. For an output signal v of a system ($\mathcal{S}, \mathcal{I}, \mathcal{N}, \mathcal{O}$, E), v is said to be true in all reachable states if and only if for all states σ, σ⊨$v^k$, for all k≧0. This check corresponds to model checking the design on arrays of original size. The illustrative embodiment provides a mechanism to check safety properties over arrays of a smaller size.

Depending on the state, some sub-expressions do not need to be evaluated. For example, for the expression mux(0, a[1], a[2]), the sub-expression a[1] must be evaluated, but the sub-expression a[2] need not be evaluated, because the multiplexor always selects its first input. As another example, for the expression write(a, $e_1$, b[f])[$e_2$], which takes the value of the write at $e_2$, if σ[[$e_1$]]=σ[[$e_2$]], the sub-expression b[f])[$e_2$], must be evaluated, and if σ[[$e_1$]]=σ[[$e_2$]], the sub-expression a[$e_2$] must be evaluated. Consider the expression write(a, e, a[4])[5]. If σ[[e]]=5, then the expressions write(a, e, a[4])[5], e, and a[4] and the indices of a: 4, 5 must be evaluated. If σ[[e]]≠5 then the expressions write(a, e, a[4])[5], e, and a[5] and the indices of a: 5 must be evaluated.

Because arrays and multiplexors propagate values only from the selected input, it is possible for an expression to have a defined value even if some array accesses are undefined. To capture the notion that some, but not all, expressions must have defined values in order to compute the value of a larger expression, the illustrative embodiment defines the set of essential expressions of an expression e in a state σ, written eexp(e, σ).

eexp(e, σ)= if e is a signal variable ⇒ {e} if e is op($e_1, \ldots, e_n$) ⇒ {e}∪ eexp($e_1$, σ)∪ ... ∪ eexp($e_n$, σ) if e is mux($e_1, e_2, e_3$)⇒

$\begin{cases} \text{if } \sigma[\![e_1]\!] \notin \{0, 1\} \Rightarrow \{e\} \cup eexp(e_1, \sigma) \\ \text{if } \sigma[\![e_1]\!] = 0 \Rightarrow \{e\} \cup eexp(e_1, \sigma) \cup eexp(e_2, \sigma) \\ \text{if } \sigma[\![e_1]\!] = 1 \Rightarrow \{e\} \cup eexp(e_1, \sigma) \cup eexp(e_3, \sigma) \end{cases}$ if e is b[$e_1$], where b is an array variable ⇒ {e} ∪ eexp($e_1$, σ) if e is write (b, $e_1, e_2$)[$e_1$]⇒

$\begin{cases} \text{if } \sigma[\![e_3]\!] \notin D\{b, \sigma\} \Rightarrow \{e\} \cup eexp(e_3, \sigma) \\ \text{if } \sigma[\![e_3]\!] \in D\{b, \sigma\} \wedge \sigma[\![e_1]\!] = \bot \Rightarrow \{e\} \cup eexp(e_1, \sigma) \\ \qquad \bigcup eexp(e_3, \sigma) \\ \text{if } \sigma[\![e_3]\!] \in D\{b, \sigma\} \wedge \sigma[\![e_1]\!] \in V \wedge \sigma[\![e_1]\!] \neq \sigma[\![e_3]\!] \Rightarrow \\ \{e\} \cup eexp(e_1, \sigma) \cup eexp(e_3, \sigma) \cup eexp(b[e_3], \sigma) \\ \text{if } \sigma[\![e_3]\!] \in D\{b, \sigma\} \wedge \sigma[\![e_1]\!] = \sigma[\![e_3]\!] \Rightarrow \\ \{e\} \cup eexp(e_1, \sigma) \cup eexp(e_2, \sigma) \cup eexp(e_3, \sigma) \end{cases}$ Under the assumption that all of the essential expresions in eexp(e, σ), not including e itself, evaluate to values in V, then e evaluates with a result σ[[e]] ∈ V. In reading the definition of eexp(e, σ), it is important to note that e is always an essential expression of itself. Also, the definition of eexp applies a case-splitting rule to array read operations with nested array writes. Because of the case-splitting rule, the expression eexp(e, σ) can contain expressions that are not sub-expressions of e.

The illustrative embodiment also defines a function eindx, whose value is a set of index values of an array. Intuitively, the value of eindx is a set of array indices that are essential for evaluating an expression. The function eindx(e, σ, a) results in a set of array indices {array_indices} ⊆ V. The set of essential indices of an array variable a with respect to an expression e and a state σ is the set of values in V of signal expressions f such that b[f] is an essential expression, where b is an array expression with root(b)=a. Formally, the illustrative embodiment defines eindx(e, σ, a) as follows:

eindx(e, σ, a)=

{σ[[f]]|σ[[f]]∈D(a,σ) ∧ ∃b:b[f]∉eexp(e,σ), where b is an array expression and root (b)=a}.

The following is a recursive definition of the function eindx, obtained by expanding the recursive definition of eexp in the original definition of eindx, and performing some simplifications:

eindx (e, σ, a)=
if e is a signal value ⇒ ∅
if e is op ($e_1, \ldots, e_n$) ⇒ eindx ($e_1$, σ, a) ∪ ... ∪ eindx($e_n$, σ, a)
if e is mux($e_1, e_2, e_3$) ⇒

$$\begin{cases} \text{if } \sigma[\![e_1]\!] \notin \{0, 1\} \Rightarrow eindx(e_1, \sigma, a) \\ \text{if } \sigma[\![e_1]\!] = 0 \Rightarrow eindx(e_1, \sigma, a) \cup eindx(e_2, \sigma, a) \\ \text{if } \sigma[\![e_1]\!] = 1 \Rightarrow eindx(e_1, \sigma, a) \cup eindx(e_3, \sigma, a) \end{cases}$$

if e is b[$e_1$], where b is an array expression ⇒

$$\begin{cases} \text{if } \sigma[\![e_1]\!] \notin D\{b, \sigma\} \Rightarrow eindx(e_1, \sigma, a) \\ \text{if } \sigma[\![e_1]\!] \in D\{b, \sigma\} \wedge root(b) \neq a \Rightarrow eindx(e_1, \sigma, a) \\ \quad \bigcup eindx_A(b, \sigma[\![e_1]\!], \sigma, a) \\ \text{if } \sigma[\![e_1]\!] \in D\{b, \sigma\} \wedge root(b) = a \Rightarrow \\ \{\sigma[\![e_1]\!]\} \cup eindx(e_1, \sigma, a) \cup eindx_A(b, \sigma[\![e_1]\!], \sigma, a) \end{cases}$$

$eindx_A$ (b, i, σ, a)=
if b is an array variable ⇒ ∅
if b is write ($b_1, e_1, e_2$)⇒

$$\begin{cases} \text{if } \sigma[\![e_1]\!] = \bot \Rightarrow eindx(e_1, \sigma, a) - iset \\ \text{if } \sigma[\![e_1]\!] = i \Rightarrow (eindx(e_1, \sigma, a) \cup eindx(e_2, \sigma, a)) - iset \\ \text{if } \sigma[\![e_1]\!] \in V \wedge \sigma[\![e_1]\!] \neq i \Rightarrow (eindx(e_1, \sigma, a) \\ \quad \bigcup eindx_A(b, i, \sigma, a)) - iset \\ \text{where } iset = (\text{if } root(b) = a \text{ then}\{i\} \text{ else}\varnothing) \end{cases}$$

If an expression e evaluates to a value in V in a state σ, then there is a state σ' that gives e the same value and such that each array variable is only defined over the essential indices of the variable in σ. In other words, let e be a signal expression and σ be a state such that σ[[e]]∈ V. There exists a state σ', such that for all array variables a, dom(σ'(a))=eindx (e, σ, a), and σ[[e]]=σ'[[e]].

In accordance with the illustrative embodiment, σ'≦σ if and only if:
1. For all signal variables e, σ' (e)=(e), and
2. For all array variables a. (a) dom (σ'(a)) ⊆ dom (σ(a)), and (b) ∀x ∈ dom(σ'(a)): σ' (a)(x)=σ(a)(x).

The function eindx(e, σ, a)→{array_indices} has the following property:

For all e, σ, a, there exists a state σ' such that σ'≦σ; for all array variables a, dom(σ'(a))=eindx(e, σ, a); and, σ'[[e]]=σ[[e]]. If σ[[e]]∈V, then σ' is the smallest state such that σ'≦σ and σ'[[e]]=σ[[e]].

Suppose σ[[e]]=i, for some i ∈ V, consider states σ' such that σ'≦σ. There are two cases:
1. If ∀a:eindx (e, σ, a)⊆ dom (σ'(a)) then σ'[[e]]=i.
2. If ∃a:eindx (e, σ, a)⊄ dom (σ'(a)) then σ'[[e]]=⊥.

From the above, one sees that if σ[[e]]=v for v∈ V, then there is a state σ' such that for each array variable a, the size of array a is |eindx(e, σ, a)|, and σ'[[e]]=v. To evaluate an expression e over all states, it is sufficient to evaluate e over all states where the size of array a is $$\sum(e, a) = \max_{\sigma} |eindx(e, \sigma, a)|.$$

The function Σ(e, a) is an exact upper bound on the value of |eindx(e, σ, a)| over all states; Σ(e, a) always has a defined value when V is finite, because the value of eindx is a subset of V. The function Σ(e, a) gives an upper bound on the size of arrays needed to test if an expression is satisfiable. Note that |eindx(e, σ, a)| is the size of the essential index set.

A safety property p is true over all initial states in a type $\mathcal{T}$ if and only if:

∀ σ ∈ $\mathcal{T}$ ∀k: σ[[$p^k$]]=1

Define a function Σ*(p): array_variables→N by the following:

$$\sum\nolimits^{*}(p)(a) = \max_{k \geq 0} \max_{\sigma \in T} |eindx(p^k, \sigma, a)|,$$

where N is the set of natural numbers. Suppose ∀a: Σ*(p)(a)≦|$\mathcal{T}$|(a). Let $\mathcal{T}$ '={σ'|∃σ∈$\mathcal{T}$ : σ'≦σ ∧ |σ'|=Σ*(p)}, then safety property p is true over all states in $\mathcal{T}$ if and only if ∀ σ ∈ $\mathcal{T}$ ', ∀k≧0: σ[[$p^k$]]∈{1, ⊥}. Checking a safety property p is reduced to states of size Σ*(p).

FIG. 1 is an example electronic design with a memory array in which aspects of the illustrative embodiments may be implemented. On each clock cycle, the design inputs values to the signals RADDR, WADDR, and DATA. The array MEM is an array state variable. Multiplexor 112 receives as inputs a constant, zero (0), and an input data value, DATA. Comparator 110 determines whether DATA is greater than a constant, 200. The output of comparator 110 selects an input for multiplexor 112 such that multiplexor 112 outputs DATA if DATA is greater than 200 and outputs zero if DATA is not greater than 200. Write component 108 writes the output of multiplexor 112 to memory array (MEM) 104 at an input write address, WADDR.

The example electronic design shown in FIG. 1 comprises a correctness property, SAFE. Read component 102 reads memory array 104 at an input read address, RADDR. Comparator 106 determines whether the value read by read component 102 is not equal to a constant, 100. If the value is not equal to 100, the correctness property, SAFE, is true (1); otherwise, SAFE is false (0).

The illustrative embodiment renders the example in the formalism described above. The system is $M = (S, I, N, O, E)$, where the set of state variables is $S = \{MEM\}$, the set of input variables is $I = \{RADDR, WADDR, DATA\}$, and the set of output variables is $O = \{SAFE\}$. The next state function, $N$, and the output function, $E$, for the example electronic design shown in FIG. 1 may be expressed as follows:

$N$ (MEM)=write(MEM, WADDR, mux(DATA>200, DATA, 0))

$E$ (SAFE)=MEM[RADDR]≠100

For this system, the first few expansions of MEM and SAFE are as follows:

SAFE$^0$=MEM$^0$[RADDR$^0$]≠100
MEM$^1$=write(MEM$^0$, WADDR$^0$, mux(DATA$^0$>200, DATA$^0$, 0)
SAFE$^1$=write(MEM$^0$, WADDR$^0$, mux(DATA$^0$>200, DATA$^0$, 0))[RADDR$^1$]≠100
MEM$^2$=write(write(MEM$^0$, WADDR$^0$, mux(DATA$^0$>200, DATA$^0$, 0)), WADDR$^1$, mux(DATA$^1$>200, DATA$^1$, 0))
SAFE$^2$=MEM$^2$[RADDR$^2$]≠100

One can easily see by inspection that exactly one array index expression appears in SAFE$^k$, for any value of k. It follows that it is sound and complete to verify the output signal SAFE as a safety property by evaluating SAFE$^k$, for all k, in states where MEM is modeled as a single-element array.

Figure 2:
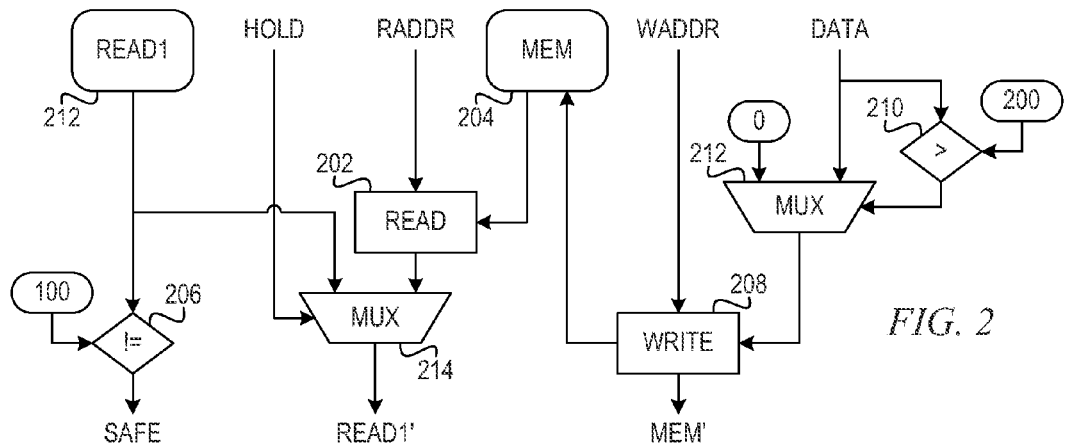
FIG. 2 is an example of an electronic design with unbounded latency in which aspects of the illustrative embodiments may be implemented.

FIG. 2 is an example of an electronic design with unbounded latency in which aspects of the illustrative embodiments may be implemented. On each clock cycle, the design inputs values to the signals RADDR, WADDR, DATA, and HOLD. The array MEM is an array state variable. Multiplexor 212 receives as inputs a constant, zero (0), and an input data value, DATA. Comparator 210 determines whether DATA is greater than a constant, 200. The output of comparator 210 selects an input for multiplexor 212 such that multiplexor 212 outputs DATA if DATA is greater than 200 and outputs zero if DATA is not greater than 200. Write component 208 writes the output of multiplexor 212 to memory array (MEM) 204 at an input write address, WADDR.

The example electronic design shown in FIG. 2 comprises a correctness property, SAFE. Read component 202 reads memory array 204 at an input read address, RADDR. Multiplexor 214 receives as one input the output of read component 202. Multiplexor 214 outputs to state variable READ1 222. On each cycle, the variable READ1 either holds its previous value from READ1 222 or stores the output of the array read, depending on the value of the input signal HOLD. Comparator 206 determines whether the value of READ1 222 is not equal to a constant, 100. If the value is not equal to 100, the correctness property, SAFE, is true (1); otherwise, SAFE is false (0).

Because the value read from the array can be held for an unbounded amount of time in READ1 before reaching the output, prior art solutions cannot easily or efficiently reduce the size of the array. In contrast, the illustrative embodiments can reduce the array to one entry for the above example.

The illustrative embodiments provide a mechanism for approximating a size for an abstracted array for which correctness of the design with the abstracted array implies correctness of the original design. To do so, consider the following function, which is defined above:

$$\sum^*(p)(a) = \max_{k \geq 0} \max_{\sigma \in T} |eindx(p^k, \sigma, a)|$$

This equation is difficult to compute. The illustrative embodiment proposes an efficient way to over-approximate this equation.

To obtain an accurate estimate, the illustrative embodiment defines a function that computes the sets of possible index expressions. For any non-empty set X whose elements are finite sets, let $\|X\lambda\|$ be the largest size of an element of X, $\max_{x \in X} |x|$. The function $\phi$ (e, a), defined below, computes a set of sets of index expressions with the property that $\Sigma$ (e, a)$\leq \|\phi(e, a)\|$. First, the illustrative embodiment defines X ⊎ Y for sets X, Y:

X ⊎ Y = $\{x \cup y | x \in X, y \in Y\}$

Then, the illustrative embodiment defines $\phi$ (e, a), where e is an expression and a is an array variable, as follows:

$\phi(v, a) = \{\emptyset\}$, if v is a signal variable or an array variable
$\phi(c, a) = \{\emptyset\}$, if c is a constant
$\phi(op(e_1, \ldots, e_n), a) = \phi(e_1, a) \uplus \ldots \uplus \phi(e_{n, a})$
$\phi(mux(e_1, e_2, e_3), a) = (\phi(e_1, a) \uplus \phi(e_2, a)) \cup (\phi(e_1, a) \uplus \phi(e_3, a))$ $$\phi(b[e], a) = \begin{cases} \phi(b, a) \uplus \phi(e, a) \uplus \{\{e\}\} & \text{if root}(b) = a \\ \phi(b, a) \uplus \phi(e, a) & \text{otherwise} \end{cases}$$

$\phi$ (write(b, e$_1$, e$_2$), a)=($\phi$(e$_1$, a)=(e$_1$, a)) ⊎ $\phi$ (e$_2$, a)∪($\phi$ (e$_1$, a) ⊎ $\phi$ (b, a))

For any signal expression e, state σ, and array variable a, |eindx (e, σ, a)|$\leq \|\sigma(e, a)\|$. For every σ, ∃s, $\in \phi$ (e, a): eindx (e, σ, a)$\subseteq$ σ(s$_1$).

In order to create sound abstractions for model checking, the illustrative embodiment computes an upper bound on the sequence $\phi$ (v$^0$, a), $\phi$ (v$^1$, a), . . . , when an upper bound exists. One way of computing an upper bound uses a generalization of function $\phi$ (e, a) to a function $\Phi$ (e, a, θ, θ$_A$), where e is an expression, a is an array variable, and θ is a function mapping variables to sets of expressions. The idea is that the algorithm will iterate, at each step setting θ(v) to a set that is at least as general as each element of $\Phi$ (v$^k$, a). The θ functions will provide a simple way to detect when a fixed point is reached in the iteration.

For a signal variable s, θ(s) will have the form $\{x_1, \ldots, x_n\}$ for some n, where the $x_i$ are fresh distinct signal variables. The illustrative embodiment sets θ(s) to a set of fresh variables larger than the set of essential indices needed to evaluate s$^k$. For array variables, the illustrative embodiment defines θ$_A$(b, e) to be a function taking an array variable b and a signal expression e, and returning a set of signal variables $\{x_{e,1}, \ldots, x_{e,n}\}$, for some n. The subscript on e simply indicates that $x_{e,1}$ is a fresh distinct signal variable related to e.

The definitions of $\phi(v, a)$ and $\Phi(v, a, θ, θ_A)$ differ in the case when v is a signal or array variable; in these cases $\Phi$ applies the function θ or θ$_A$. The illustrative embodiment assigns functions θ, θ$_A$ increasingly large sets as the algorithm iterates. The illustrative embodiment defines $\Phi$(e, a, θ, θ$_A$) and $\Phi_A$ (b, e, a, θ, θ$_A$) by mutual recursion as follows:

$\Phi(v, a, θ, θ_A) = \{θ(v)\}$ if v is a signal variable
$\Phi(c, a, θ, θ_A) = \{\emptyset\}$ if c is a constant $\Phi(op(e_1, \ldots, e_n), a, \theta, \theta_A) = \Phi(e_1, a, \theta, \theta_A) \uplus \ldots \uplus \Phi(e_n, a, \theta, \theta_A)$ $\Phi(mux(e_1, e_2, e_3), a, \theta, \theta_A) = (\Phi(e_1, a, \theta, \theta_A) \uplus \Phi(e_2, a, \theta, \theta_A)) \cup (\Phi(e_1, a, \theta, \theta_A) \uplus \Phi(e_3, a, \theta, \theta_A))$ $$\Phi(b[e], a, \theta, \theta_A) = \begin{cases} \Phi_A(b, e, a, \theta, \theta_A) \uplus \Phi(e, a, \theta, \theta_A) \\ \left[\uplus\right]\{\{e\}\} \text{if root}(b) = a \\ \Phi_A(b, e, a, \theta, \theta_A) \uplus \Phi(e, a, \theta, \theta_A) \text{otherwise} \end{cases}$$

$\Phi_A(b, e, a, \theta, \theta_A) = \{\theta_A(b, e)\}$ if b is an array variable $\Phi_A$(write(b, $e_1$, $e_2$), e, a, $\theta$, $\theta_A$)=
$(\Phi(e_1, a, \theta, \theta_A) \uplus (\Phi(e_2, a, \theta, \theta_A), \cup^- \text{eset})) \cup (\Phi(e_1, a, \theta, \theta_A) \uplus \Phi_A(b, e, a, \theta, \theta_A))$, where eset=(if root (b)=a then $\{e_1\}$ else $\emptyset$)

Given a system $\mathcal{M} = (\mathcal{S}, \mathcal{I}, \mathcal{N}, \mathcal{O}, \mathcal{E})$, the illustrative embodiments define a sequence of approximations to $\phi(s^k, a)$, for each signal state variable s, and approximations to $\phi$ ($b^k$, a), for each array variable b. In the following equations, s is a signal variable, b is an array variable, e is a signal expression, and k is a natural number. The definitions use $\mathcal{N}$ (v), the next-state expression for the state variable v.

approx$^0$ (s, a)=$\{\emptyset\}$
approx$^{k+1}$ (s, a)=$\Phi(\mathcal{N}$ (s), a, $\theta^{a,k}, \theta_A^{a,k})$
approx$_A^0$ (b, e, a)=$\{\emptyset\}$
approx$_A^{k+1}$ (b, e, a)=$\Phi_A(\mathcal{N}$ (b), e, a, $\theta^{a,k}, \theta_A^{a,k})$
$\theta^{a,0}$ (s)=$\emptyset$
$\theta^{a,k+1}$ (s)=$\{s_1, \ldots s_n\}$,
where n=$\|$approx$^{k+1}$ (s, a)$\|$
and $s_1, \ldots, s_n$ are distinct fresh signal variables
$\theta_A^{a,0}$ (b, e)=$\emptyset \theta_A^{a,k+1}$ (b, e)=$\{b_{e,1}, \ldots, b_{e,n}\}$,
where n=$\|$approx$_A^{k+1}$ (b, 0, a)$\|$
and $b_{e,1}, \ldots, b_{e,n}$ are distinct fresh signal variables For $k \geq 0$, let size$^k$ (v, a)=$\|$approx$^k$ (v, a)$\|$ be the size of the kth approximation. For an output variable v, the illustrative embodiment defines size$^k$ (v, a) using the approximations for the state variables:

size$^k$(v,a)=$\|\Phi(\mathcal{E}$ (v),a,$\theta^{a,k},\theta_A^{a,k})\|$

The purpose of size$^k$ (v, a) is to make successive over-approximations to the value of $\Sigma(s^k)(a)$. The mechanism of the illustrative embodiment begins by setting the first approximation, size$^0$ (s, a) to 0 (zero). At teach successive step, the mechanism makes $\theta^k$ (s) be a set of n distinct signal variables if the value of size$^k$ (s, a) is n. This gives an over-approximation because, for example, there is no sharing of common expressions in $v^{a,k}$ ($s_i$), $\theta^{a,k}$ ($s_j$), when $s_i, s_j$ are different state variables. At each step the mechanism uses the next-state expression $\mathcal{N}$ (s) to compute the maximal sets of indices needed for the array variable a in the next expansion of s.

The illustrative embodiments provide an algorithm, compute_size, for computing a size for an array variable a that makes a sound and complete model for checking a property output variable v of a system. The inputs of compute_size are a system $\mathcal{M}$, a signal variable v of $\mathcal{M}$, an array variable a, and a natural number OriginalSize. The value of OriginalSize is the size of the array a in the original model. The algorithm computes size$^k$ (v, a) for increasing values of k, until either a fixed point is reached or size$^k$ (v, a)>OriginalSize.

The mechanism defines a set dep(v) of state variables on which a variable depends. For a state variable v, let dep(v) be the smallest set of state variables such that 1) v∈ dep(v), and 2) for all state variables v', if v'∈ dep(v) and v" is a state variable appearing in $\mathcal{N}$ (v'), then v" ∈ dep(v). For an output variable v, the mechanism defines dep(v) to be the union of dep(v') over all state variables v' appearing in $\mathcal{E}$ (v).

The algorithm compute_size is as follows:
1) k←0; MaxSize←0;
2) Until (($\forall$v'∈dep(v): size$^k$(v',a)=size$^{k+1}$(v',a)) $\vee$ size$^k$(v,a)> OriginalSize) Do {MaxSize←max (size$^k$ (v, a), MaxSize); k←k+1};
3) If size$^k$ (v, a)>OriginalSize then return OriginalSize;
4) If $\forall$v'∈ dep(v): size$^k$ (v', a)=size$^{k+1}$ (v', a) then return MaxSize;

The algorithm always terminates, because for k$\geq$0, size$^{k+1}$ (v, a)$\geq$size$^k$ (v, a). If the algorithm exits with $\forall$v' ∈ dep(v): size$^k$ (v', a)=size$^{k+1}$ (v'a), then it is easy to see that the size computation has reached a fixed point at step k: The value of $\Phi$ for each state variable v depends on the previous values of $\theta$(v') for the variables v' appearing in $\mathcal{N}$ (v). If size$^k$ (v', a)=size$^{k+1}$ (v, a) for all v' in the transitive fan-in of v, then the size computation for v is at a fixed point. Because $\forall$k$\geq$0: $\Sigma(v^k)(a) \leq$size$^k$ (v, a), the mechanism sets the variable MaxSize to a value that is at least as large as any of the approximate values: $\forall$k$\geq$0: $\Sigma(v^k)(a) \leq$MaxSize. The mechanism can construct a sound and complete abstraction for evaluating v in $\mathcal{M}$ by using compute-size to assign the size of each array variable.

The accuracy of the size computation can be improved by taking shared expressions into account in $\theta, \theta_A$. The mechanism initially defined $\theta$ so that for distinct signal variables $s_i, s_j, \theta(s_i) \cap \theta(s_j)=\emptyset$. The illustrative embodiment obtains a more accurate estimate of the number of indices used by defining $\theta$ to cover all of the sets of indices at the previous step of the iteration, while preserving some information about shared expressions. In this construction, $\theta$ will contain two kinds of variables: shared variables that appear in $\theta$(s) for more than one variable s, and unshared variables. The mechanism considers the definition of $\theta$ for signal variables, and then extends the definition to $\theta_A$ for array variables.

The illustrative provides an algorithm for computing $\theta$(s) with sharing. The algorithm takes as input s, a signal state variable, and X, a two-level set of expressions. The algorithm for $\theta$(s) is as follows:
1) $\theta$(s)←$\emptyset$
2) n←$\|X\|$
3) Choose an expression e that appears in every element of X, if such an expression exists. Note: e can be either an expression over state and input variables or a variable appearing in the previous value of $\theta$(s). It is preferable to choose an e that appears in the set of indices approx (s', a) for a different signal variable s', since this will more likely lead to sharing.
4) If there is no choice for e, then $\{\theta(s) \leftarrow (s) \cup \{$n fresh new non-shared variables$\}$; Return $\theta$ (s)$\}$
5) $\theta(s) \leftarrow \theta(s) \cup \{x_e\}$, where $x_e$ is a shared variable corresponding to the expression e.
6) X←$\{x-\{e\}$:x ∈X$\}$
Note that the mechanism removes e from all elements of X, not just maximal elements.
7) Go to 2

For array variables, it is more complicated to introduce sharing. Recall that $\theta_A^a$(b, e) is intuitively an over-approximation to the set of essential indices of the array a in b[e]. Since the expressions in b[e], b[f], can depend on different array indices of a, the illustrative embodiment defines $\theta_A^a$(b, e) to contain distinct variables for each expression e, That is, if $\|\Phi_A(\aleph(b), e, a, \theta^a, \theta_A^a)\|=n$, the mechanism defines the next $\theta_A^a(b, e)$ to be $\{x_{1,e}, \ldots, x_{n,e}\}$.

To introduce shared variables in the definition of $\theta_A$, the illustrative embodiment makes sure that sharing exists for all e in $\Phi_A(\aleph(b), e, a, \theta^a, \theta_A^a)$. The illustrative embodiment does this by computing $\Phi$ for two values of e and taking the union. Let $X=\Phi_A(\aleph(b), 0, a, \theta^a, \theta_A^a) \in \Phi_A(\aleph(b), 1, a, \theta^a, \theta_A^a)$. The mechanism uses this set X as the input to an algorithm for computing $\theta_A(b, f)$ for an array variable b and an expression f with sharing. The algorithm takes as input b, an array state variable; X, a two-level set of expressions; and, f, an expression. The algorithm is as follows:

1) $\theta_A(b, f) \leftarrow \emptyset$
2) $n \leftarrow \|X\|$
3) Choose an expression e that appears in every element of X, if such an expression exists.
4) If there is no choice for e, then $\{\theta_A(b, f) \leftarrow \theta_A(b, f) \cup \{n$ fresh new non-shared variables $x_{1,f}, \ldots, x_{n,f}\}$. Return $\theta_A(b, f)\}$.
5) $\theta_A(b, f) \leftarrow \theta_A(b, f) \cup \{x_e\}$, where $x_e$ is a shared variable corresponding to the expression e.
6) $X \leftarrow \{x-\{e\}: x \in X\}$
7) Go to 2

Figure 3:
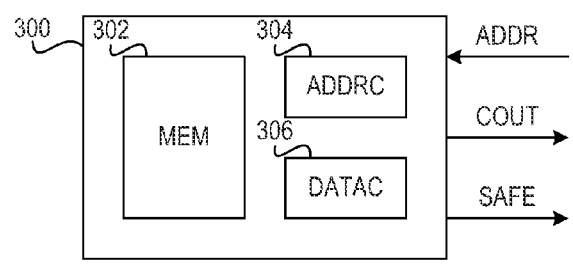
FIG. 3 is a diagram of an example circuit with a very simple cache memory in which aspects of the illustrative embodiments may be implemented.

FIG. 3 is a diagram of an example circuit with a very simple cache memory in which aspects of the illustrative embodiments may be implemented. Very simple cache memory 300 includes a memory array 302, an address cache (ADDRC) 304 and a data cache (DATAC) 306. Very simple cache memory 300 receives as input an address (ADDR) and provides as output a cache output (COUT) and a safety property (SAFE).

Using the syntax developed above, the design in FIG. 3 may be expressed as follows:

$\aleph$ (MEM)=MEM let ADDRC_valid=(ADDRC[key(ADDR)]=ADDR)

$\aleph$ (ADDRC)=write(ADDRC, key(ADDR), mux(ADDRC_valid, ADDRC[key(ADDR)], ADDR)

$\aleph$ (DATAC)=write(DATAC, key(ADDR), mux(ADDRC_valid, DATAC[key(ADDR)], MEM[ADDR]))

$\mathcal{E}$ (COUT)=mux(ADDR≠0 ∧ADDRC_valid, DATAC[key(ADDR)], MEM[ADDR])

$\mathcal{E}$ (SAFE)=(COUT=MEM[ADDR])

FIG. 4 illustrates computation of the size of an example abstracted array in accordance with the illustrative embodiment. The three tables in FIG. 4 show how an adequate size is computed for each of the state variables, respectively MEM in the table in top of FIG. 4, DATAC in the center table, and ADDRC in the bottom table. Starting with the top table, FIG. 4 shows the computation of the number of array indices of the array MEM that are needed to evaluate the state variables ADDRC, DATAC, and MEM, at different time steps. The line labeled k=0 shows that a time 0, the number of array indices of the array MEM needed is 0 for each of ADDRC, DATAC, and MEM. The line k=1 shows that at time 1, the array DATAC depends on 1 array index of MEM. The reason DATAC depends on MEM is that the next-state expression for DATAC contains an array read expression involving MEM. The other state variables ADDRC and MEM have next-state expressions that do not involve reading MEM, so they need 0 array indices at time 1. The line labeled k=2 shows that the algorithm reaches a fixed point. The array DATAC needs only one index of MEM.

The reason that DATAC needs only one index of MEM is that on each clock cycle, the next-state expression for DATAC either keeps the contents of DATAC unchanged, or writes data from one array index of MEM into an element of DATAC. The algorithm therefore labels DATAC as needing only 1 array index of MEM. Since all of the three state variables ADDRC, DATAC, and MEM use the same number of indices at times k=1 and k=2, the algorithm detects that a fixed point has been reached. Next the algorithm computes the number of indices needed for the output variables COUT and SAFE. According to the equation for COUT, COUT references one array location of DATAC. Since DATAC needs one location of MEM, the algorithm computes that DATAC needs one location of MEM. The output equation for SAFE mentions COUT and has an array read expression MEM[ADDR]. Since COUT uses one index of MEM and the array read expression MEM[ADDR] uses one location of MEM, the algorithm marks SAFE as needing two indices of MEM. Therefore, the algorithm returns size 2 for the adequate size of array MEM.

The center table in FIG. 4 shows the computation of adequate array size for the array DATAC. The next-state expressions for the variables ADDRC and MEM do not involve reading data from DATAC, so ADDRC and MEM need no indices of DATAC at times k=0 and k=1. The next-state expression for DATAC writes to the location DATAC[KEY(ADDR)] on each clock cycle. The value written to DATAC[KEY(ADDR)] is either the same data that was already present in DATAC[KEY(ADDR)], or the value MEM[ADDR]. For these two possible values, the algorithm computes that the number of indices of DATAC needed to evaluate DATAC is the same at times k=0 and k=1. The algorithm reaches a fixed point at time k=1. Next, the algorithm computes the number of indices of DATAC needed to evaluate the output variables COUT and SAFE. Since the output equation for COUT has one array read expression involving DATAC, COUT needs one index of DATAC. Since SAFE uses the value of COUT, SAFE needs one index of DATAC.

The bottom table in FIG. 4 shows the computation of adequate array size for the array ADDRC. In this case, the size approximation algorithm determines that the array DATAC can potentially access a different index of the array ADDRC on each clock cycle, and values depending on ADDRC are written to DATAC. The result is that after k clock cycles, the algorithm estimates that DATAC may depend on k array indices of ADDRC. The algorithm does not reach a fixed point, and the result is that the size of the array ADDRC is not reduced.

The illustrative embodiments provide a mechanism that uses the semantics and expressions described above to evaluate the correctness of a system where the sizes of arrays have been reduced to an adequate size. In this construction, the mechanism replaces each signal of the original design with a composite signal having two elements: a value, which represents the value of the signal in the original design, and a defined bit v, which represents the value ⊥. FIG. 5A illustrates a composite signal in accordance with an illustrative embodiment. Each state register is replaced with a register of the composite type. The signal operations of the original design are replaced with versions of the operations that recognize the value ⊥.

Each output property signal p is replaced with an expression of the form p≠⊥→p=true. The mechanism uses model checking to verify that each of the new output property expressions is always true.

The mechanism replaces an array of data values with a smaller, abstracted array of rows having a value, which represents the value of the array element in the original design, a defined bit v, which represents the value ⊥, and an address. FIG. 5B illustrates an abstracted array in accordance with an illustrative embodiment.

FIGS. 6A-6G illustrate construction of an abstracted model using a hardware description language in accordance with an example embodiment. If the original model uses very high speed integrated circuit (HSIC) hardware description language (VHDL) type data_type, then the mechanism defines a new record type, as shown in FIG. 6A, and systematically replaces all variables of the old type with variables of the new type. The mechanism replaces a signal operation on two inputs, op (arg1, arg2), with an operation on record types as shown in FIG. 6B.

For a multiplexor whose original definition is shown in FIG. 6C, the mechanism defines a new multiplexor operation that uses record types, as shown in FIG. 6D.

For an array of type array (addr_type) of data_type, the mechanism defines a new type as shown in FIG. 6E. With these definitions, an abstracted array is a record whose first component is an array containing the data of the array and whose second component is an array containing the addresses that are modeled by the abstracted array. When the mechanism of the illustrative embodiment verifies the abstracted model, the addresses are chosen non-deterministically to have any possible value. The mechanism defines read and write operations on abstracted arrays as shown in FIGS. 6F and 6G.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage-medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

FIG. 7 is a flowchart illustrating operation of a mechanism for verifying electronic designs with memory arrays and unbounded latency in accordance with an illustrative embodiment. Operation begins, and the mechanism receives an original electronic design (block 702). The original electronic design may be a model in word-level logic. The mechanism determines an adequate size for a reduced, abstracted array such that the reduced model is sound and complete for a safety property in the original model (block 704).

The mechanism builds an abstracted design using the adequate size for the reduced array (bock 706). The mechanism builds the abstracted design by replacing each signal with a composite signal having a value, which represents the value of the signal in the original design, and a defined bit, which represents the value 1, and replacing each array of values with a reduced array where each row has a value, representing the value of the array element in the original design, a defined bit, which represents the value 1, and an address modeled in the abstracted model.

The mechanism verifies correctness of the abstracted design by model checking (block 708). Thereafter, operation ends.

FIG. 8 is a flowchart illustrating operation of a mechanism for determining an adequate size for a reduced, abstracted array in accordance with an illustrative embodiment. Operation begins, and the mechanism sets X to a set containing the empty set (block 802). That is, X is a set of sets, where the only set in X has no elements. Thus, initially, X would result in a size of zero. The mechanism then sets SIZE to zero (0) (block 804) and initializes K to zero (0) (block 806).

The mechanism sets LAST_SIZE equal to SIZE (block 808). Then, the mechanism determines a value of SIZE based on the next state expression of the design using X to indicate a set of symbolic indices for the previous step (block 810). The mechanism determines whether SIZE is equal to LAST_SIZE (block 812). If SIZE is not equal to LAST_SIZE, the mechanism determines whether SIZE is greater than the original size of the array (block 814), If the mechanism determines that SIZE equals LAST_SIZE in block 812, meaning the over-approximation of SIZE has converged then the mechanism returns SIZE (block 816), and operation ends. If the mechanism determines that SIZE is greater than the original size from the electronic design in block 814, meaning the size cannot be reduced, then the mechanism returns the original size (block 815), and the operation ends.

If the mechanism determines that SIZE is not greater than the original size of the array in block 814, the mechanism creates a symbolic set having SIZE number of elements (block 818). The symbolic set may provide a set of simplified expressions, such as a set of arbitrary signals that approximates the size resulting from evaluating the complex expression of the original design. The mechanism sets X to a set containing the symbolic set (block 820). Again, X is a set of sets; however, the set has a number of elements equal to SIZE; therefore, in the next step, X is a set containing a symbolic set that has a number of elements equal to SIZE from the previous step. The mechanism then evaluates the next step K (block 822), and operation returns to block 808.

The mechanism repeats the process, setting LAST_SIZE equal to SIZE and determining SIZE for the current step using X from the previous step, until SIZE converges in block 812 or the mechanism determines that the array cannot be reduced in block 814.

Figure 9:
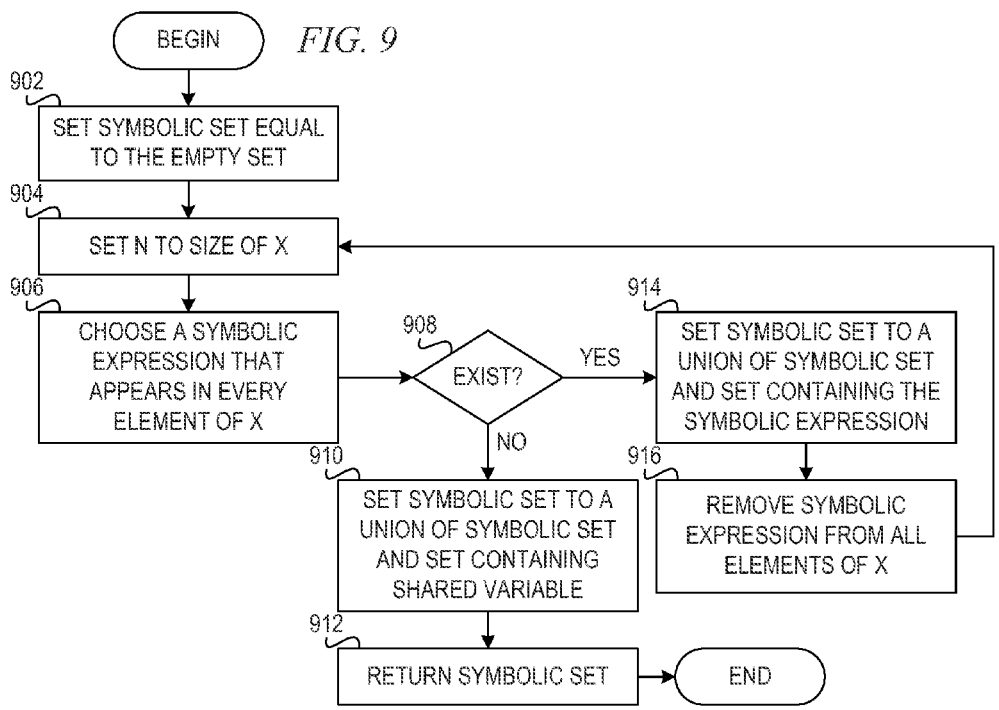
FIG. 9 is a flowchart illustrating operation of a mechanism for creating a symbolic set with sharing in accordance with an example embodiment.

FIG. 9 is a flowchart illustrating operation of a mechanism for creating a symbolic set with sharing in accordance with an example embodiment. Operation begins, and the mechanism sets a symbolic set equal to the empty set (block 902) and sets N to the size of the set X (block 904). The mechanism chooses a symbolic expression that appears in every element of X, if such an expression exists (block 906). The mechanism determines whether a symbolic expression that appears in every element of X exists (block 908).

If an expression does not exist, then the mechanism sets the symbolic set to a union of the previous symbolic set and a set containing N number of non-shared variables (block 910). The mechanism then returns the symbolic set (block 912). Thereafter, operation ends.

If an expression does exist that appears in every element of X in block 908, the mechanism sets the symbolic set to a union of the previous symbolic set and a set containing a shared variable that corresponds to the symbolic expression (block 914). The mechanism then removes the symbolic expression from all elements of X (block 916). Thereafter, operation returns to block 904 to set N to the size of X and repeats until no expression exists that appears in every element of X.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The illustrative embodiments may be utilized in many different types of data processing environments. In order to provide a context for the description of the specific elements and functionality of the illustrative embodiments, FIG. 9 is provided hereafter as an example environment in which aspects of the illustrative embodiments may be implemented. It should be appreciated that FIG. 9 is only an example and is not intended to assert or imply any limitation with regard to the environments in which aspects or embodiments of the present invention may be implemented. Many modifications to the depicted environment may be made without departing from the spirit and scope of the present invention.

Figure 10:
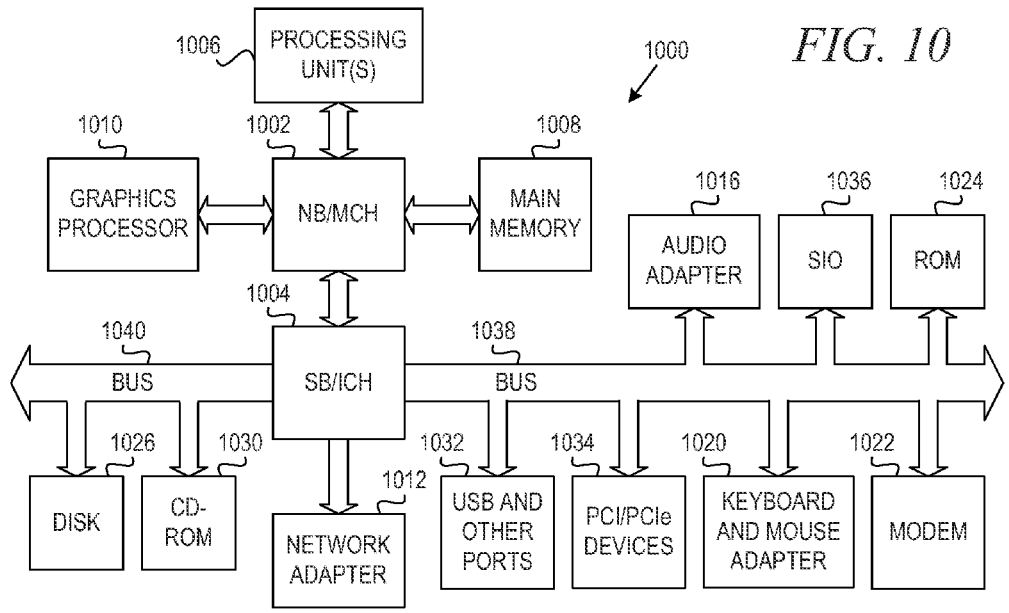
FIG. 10 is a block diagram of an example data processing system in which aspects of the illustrative embodiments may be implemented.

FIG. 10 is a block diagram of an example data processing system in which aspects of the illustrative embodiments may be implemented. Data processing system 1000 is an example of a computing system in which computer usable code or instructions implementing the processes for illustrative embodiments of the present invention may be located or in which hardware logic or a combination of hardware logic and computer usable code/instructions may be provided for implementing the various aspects of the illustrative embodiments described hereafter, or equivalents thereof.

In the depicted example, data processing system 1000 employs a hub architecture including north bridge and memory controller hub (NB/MCH) 1002 and south bridge and input/output (I/O) controller hub (SB/ICH) 1004. Processing unit 1006, main memory 1008, and graphics processor 1010 are connected to NB/MCH 1002. Graphics processor 1010 may be connected to NB/MCH 1002 through an accelerated graphics port (AGP).

In the depicted example, local area network (LAN) adapter 1012 connects to SB/ICH 1004. Audio adapter 1016, keyboard and mouse adapter 1020, modem 1022, read only memory (ROM) 1024, hard disk drive (HDD) 1026, CD-ROM drive 1030, universal serial bus (USB) ports and other communication ports 1032, and PCI/PCIe devices 1034 connect to SB/ICH 1004 through bus 1038 and bus 1040. PCI/PCIe devices may include, for example, Ethernet adapters, add-in cards, and PC cards for notebook computers. PCI uses a card bus controller, while PCIe does not. ROM 1024 may be, for example, a flash basic input/output system (BIOS). HDD 1026 and CD-ROM drive 1030 connect to SB/ICH 1004 through bus 1040. HDD 1026 and CD-ROM drive 1030 may use, for example, an integrated drive electronics (IDE) or serial advanced technology attachment (SATA) interface. Super I/O (SIO) device 1036 may be connected to SB/ICH 1004.

An operating system runs on processing unit 1006. The operating system coordinates and provides control of various components within the data processing system 1000 in FIG. 10. As a client, the operating system may be a commercially available operating system such as Microsoft Windows 7 (Microsoft and Windows are trademarks of Microsoft Corporation in the United States, other countries, or both). An object-oriented programming system, such as the Java programming system, may run in conjunction with the operating system and provides calls to the operating system from Java programs or applications executing on data processing system 1000 (Java is a trademark of Oracle and/or its affiliates.).

As a server, data processing system 1000 may be, for example, an IBM® eServer™ System p® computer system, running the Advanced Interactive Executive (AIX®) operating system or the LINUX operating system (IBM, eServer, System p, and AIX are trademarks of International Business Machines Corporation in the United States, other countries, or both, and LINUX is a registered trademark of Linus Torvalds in the United States, other countries, or both). Data processing system 1000 may be a symmetric multiprocessor (SMP) system including a plurality of processors in processing unit 1006. Alternatively, a single processor system may be employed.

Instructions for the operating system, the object-oriented programming system, and applications or programs are located on storage devices, such as HDD 1026, and may be loaded into main memory 1008 for execution by processing unit 1006. A bus system, such as bus 1038 or bus 1040 as shown in FIG. 10, may be comprised of one or more buses. Of course, the bus system may be implemented using any type of communication fabric or architecture that provides for a transfer of data between different components or devices attached to the fabric or architecture. A communication unit, such as modem 1022 or network adapter 1012 of FIG. 10, may include one or more devices used to transmit and receive data. A memory may be, for example, main memory 1008, ROM 1024, or a cache such as found in NB/MCH 1002 in FIG. 10.

Those of ordinary skill in the art will appreciate that the hardware in FIG. 10 may vary depending on the implementation. Other internal hardware or peripheral devices, such as flash memory, equivalent non-volatile memory, or optical disk drives and the like, may be used in addition to or in place of the hardware depicted in FIG. 10. Also, the processes of the illustrative embodiments may be applied to a multiprocessor data processing system, other than the SMP system mentioned previously, without departing from the spirit and scope of the present invention.

Moreover, the data processing system 1000 may take the form of any of a number of different data processing systems including client computing devices, server computing devices, a tablet computer, laptop computer, telephone or other communication device, a personal digital assistant (PDA), or the like. In some illustrative examples, data processing system 1000 may be a portable computing device which is configured with flash memory to provide non-volatile memory for storing operating system files and/or user-generated data, for example. Essentially, data processing system 1000 may be any known or later developed data processing system without architectural limitation.

Thus, the illustrative embodiments provide mechanisms for abstraction for arrays in integrated circuit designs. The illustrative embodiments introduce logic of expressions for reasoning about arrays. The semantics of the logic permits reasoning about the value of an expression, when evaluated over states having arrays of different sizes. The illustrative embodiments show that the truth of an expression can be evaluated over a state, which may have smaller array sizes. The existence of adequate model sizes for expressions leads immediately to the existence of adequate model sizes for safety properties of systems. The illustrative embodiments propose a mechanism for safely over-approximating the minimum adequate size.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for array abstraction in an electronic design model, the method comprising:
   receiving, in the data processing system, an original design model having at least one memory array, wherein a correctness property of the original design model depends on an unbounded output of the at least one memory array;
   determining, by the data processing system, a reduced size for an abstracted memory array such that correctness of an abstracted design model comprising the abstracted memory array implies correctness of the original design model;
   building, by the data processing system, the abstracted design model using the reduced size for the abstracted memory array, wherein building the abstracted design model using the reduced size for the abstracted memory array comprises replacing each signal in the original design model with a composite signal having a value that represents a value of the signal in the original design model and a defined bit that represents a value that is out of range and replacing each memory array with a reduced array, wherein each element of the reduced array comprises a value that represents a value of the signal in the original design model, a defined bit that represents a value that is out of range, and an address that is modeled by the reduced array; and verifying, by the data processing system, correctness of the abstracted design model by model checking.

2. The method of claim 1, wherein determining a reduced size for an abstracted memory array comprises:
for each time step, determining a size based on a next state expression of the original design model using a set of symbolic indices for a previous time step until the size converges.

3. The method of claim 2, wherein determining a reduced size for an abstracted memory array further comprises:
initializing a set, X, to a set containing the empty set,
wherein determining a size based on a next state expression of the original design model using a set of symbolic indices for a previous time step comprises using X as the set of symbolic indices for the first time step.

4. The method of claim 3, wherein determining a reduced size for an abstracted memory array further comprises:
creating a symbolic set having a number of elements equal to the size determined in the previous step; and
replacing X with a set containing the symbolic set,
wherein determining a size based on a next state expression of the original design model using a set of symbolic indices for a previous time step comprises using X as the set of symbolic indices for a next time step.

5. The method of claim 4, wherein creating the symbolic set comprises removing expressions that appear in every element of the symbolic set from the symbolic set.

6. The method of claim 2, wherein determining a reduced size for an abstracted memory array further comprises:
determining that the size converges responsive to determining that the size determined in the current time step is equal to the size determined in the previous time step.

7. A computer program product comprising a computer readable storage medium having a computer readable program stored therein, wherein the computer readable program, when executed on a computing device, causes the computing device to:
receive an original design model haying at least one memory array, wherein a correctness property of the original design model depends on an unbounded output of the at least one memory array;
determine a reduced size for an abstracted memory array such that correctness of an abstracted design model comprising the abstracted memory array implies correctness of the original design model;
build the abstracted design model using the reduced size for the abstracted memory array wherein, building the abstracted design model using the reduced size for the abstracted memory array comprises replacing each signal in the original design model with a composite signal having a value that represents a value of the signal in the original design model and a defined bit that represents a value that is out of range and replacing each memory array with a reduced array, wherein each element of the reduced array comprises a value that represents a value of the signal in the original design model, a defined hit that represents a value that is out of range, and an address that is modeled by the reduced array; and verify correctness of the abstracted design model by model checking.

8. The computer program product of claim 7, wherein determining a reduced size for an abstracted memory array comprises:
for each time step, determining a size based on a next state expression of the original design model using a set of symbolic indices for a previous time step until the size converges.

9. The computer program product of claim 8, wherein determining a reduced size for an abstracted memory array further comprises:
initializing a set, X, to a set containing the empty set,
wherein determining a size based on a next state expression of the original design model using a set of symbolic indices for a previous time step comprises using X as the set of symbolic indices for the first time step.

10. The computer program product of claim 9, wherein determining a reduced size for an abstracted memory array further comprises:
creating a symbolic set having a number of elements equal to the size determined in the previous step; and
replacing X with a set containing the symbolic set,
wherein determining a size based on a next state expression of the original design model using a set of symbolic indices for a previous time step comprises using X as the set of symbolic indices for a next time step.

11. The computer program product of claim 10, wherein creating the symbolic set comprises removing expressions that appear in every element of the symbolic set from the symbolic set.

12. The computer program product of claim 8, wherein determining a reduced size for an abstracted memory array further comprises:
determining that the size converges responsive to determining that the size determined in the current time step is equal to the size determined in the previous time step.

13. The computer program product of claim 7, wherein the computer readable program is stored in a computer readable storage medium in a data processing system and wherein the computer readable program was downloaded over a network from a remote data processing system.

14. The computer program product of claim 7, wherein the computer readable program is stored in a computer readable storage medium in a server data processing system and wherein the computer readable program is downloaded over a network to a remote data processing system for use in a computer readable storage medium with the remote system.

15. An apparatus, comprising:
a processor; and
a memory coupled to the processor, wherein the memory comprises instructions which, when executed by the processor, cause the processor to:
receive an original design model having at least one memory array, wherein a correctness property of the original design model depends on an unbounded output of the at least one memory array;
determine a reduced size for an abstracted memory array such that correctness of an abstracted design model comprising the abstracted memo array implies correctness of the original design model;
build the abstracted design model using the reduced size for the abstracted memory array, wherein building the abstracted design model using the reduced size for the abstracted memory array comprises replacing each signal in the original design model with a composite signal having a value that represents a value of the signal in the original design model and a defined hit that represents a value that is out of range and replacing each memory array with a reduced array, wherein each element of the reduced array comprises a value that represents a value of the signal in the original design model, a defined bit that represents a value that is out of range, and an address that is modeled by the reduced array; and verify correctness of the abstracted design model by model checking.

16. The apparatus of claim 15, wherein determining a reduced size for an abstracted memory array comprises:

for each time step, determining a size based on a next state expression of the original design model using a set of symbolic indices for a previous time step until the size converges.

17. The apparatus of claim 16, wherein determining a reduced size for an abstracted memory array further comprises:

initializing a set, X, to a set containing the empty set, wherein determining a size based on a next state expression of the original design model using a set of symbolic indices for a previous time step comprises using X as the set of symbolic indices for the first time step.

18. The apparatus of claim 17, wherein determining a reduced size or an abstracted memory array further comprises:

creating a symbolic set having a number of elements equal to the size determined in the previous step; and replacing X with a set containing the symbolic set, wherein determining a size based on a next state expression of the original design model using a set of symbolic indices for a previous time step comprises using X as the set of symbolic indices for a next time step.

19. The apparatus of claim 18, wherein creating the symbolic set comprises removing expressions that appear in every element of the symbolic set from the symbolic set.

20. The apparatus of claim 16, wherein determining a reduced size for an abstracted memory array further comprises:

determining that the size converges responsive to determining that the size determined in the current time step is equal to the size determined in the previous time step.

* * * * *